United States Patent
Kato et al.

(10) Patent No.: US 7,064,267 B2
(45) Date of Patent: *Jun. 20, 2006

(54) GAS INSULATING APPARATUS AND METHOD FOR LOCATING FAULT POINT THEREOF

(75) Inventors: Tatsuro Kato, Hitachi (JP); Tomoaki Utsumi, Hitachi (JP); Fumihiro Endo, Hitachi (JP); Kazuo Kobayashi, Hitachi (JP); Kazuhiro Saito, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/033,306

(22) Filed: Jan. 12, 2005

(65) Prior Publication Data

US 2005/0135028 A1 Jun. 23, 2005

Related U.S. Application Data

(63) Continuation of application No. 10/070,996, filed as application No. PCT/JP00/01199 on Mar. 1, 2000, now Pat. No. 6,850,399.

(51) Int. Cl.
*H02G 15/00* (2006.01)

(52) U.S. Cl. .................. 174/41; 174/138 F; 361/93.1; 361/132

(58) Field of Classification Search ............ 361/93.1, 361/132, 137, 129–131, 117, 111, 118, 120; 174/41, 138 F, 142, 152 R See application file for complete search history.

(56) References Cited

U.S. PATENT DOCUMENTS

| 4,810,840 A | 3/1989 | Okuno |
| 6,256,592 B1 | 7/2001 | Roberts et al. |

FOREIGN PATENT DOCUMENTS

| JP | 50-78845 | 6/1975 |
| JP | 58-39203 | 3/1983 |
| JP | 8-124753 | 5/1996 |
| JP | 8-275323 | 10/1996 |
| JP | 10-210613 | 8/1998 |

*Primary Examiner*—Dean A. Reichard
*Assistant Examiner*—Jinhee Lee
(74) *Attorney, Agent, or Firm*—Mattingly, Stanger, Malur & Brundidge, P.C.

(57) ABSTRACT

The present invention combines sensor portions 22, 23 of the device for measuring either current flowing through the line from the power inlet to the power outlet or voltage, or both, and bushings 150, 160 installed at either the power inlet or the power outlet, or both, so as to reduce the size of the gas insulating apparatus. Specifically, the above-mentioned sensor portions 22, 23 are installed in the space inside the porcelain tube 15 that constitutes the bushings 150, 160. As this space, it is preferable to use the space on the outerperiphery side of the electric field relaxation member 21 provided inside the porcelain tube 15.

4 Claims, 11 Drawing Sheets

GAS INSULATING APPARATUS AND METHOD FOR LOCATING FAULT POINT THEREOF

The above-referenced patent application is a continuation application of U.S. Ser. No. 10/070,996 filed Mar. 14, 2002, now U.S. Pat. No. 6,850,399, which is a 371 of PCT/JPOO/01199, filed Mar. 1, 2000. This application is also related to U.S. application Ser. No. 10/347,686, filed Jan. 22, 2003.

FIELD OF INVENTION

The present invention relates to a gas insulating apparatus installed in electric power stations, such as switching stations and electric power substations, and method for locating a fault point thereof.

BACKGROUND OF THE INVENTION

A conventional gas insulating apparatus, for example, as disclosed in Japanese Application Patent Laid-Open all Publication No. Hei 10-210613, comprises a circuit-breaker unit, a disconnector unit, an instrument current transformer unit, an instrument voltage transformer unit, a lightning-arrester unit and bushings, wherein space between bushings is made small to reduce the size of the apparatus, thereby floor area can be reduced.

Theses days, the demand for a smaller gas insulating apparatus has been increasing. As a solution, it can be expected that devices which constitute a gas insulating apparatus can be integrated. For example, a gas insulating apparatus disclosed in Japanese Application Patent Laid-Open Publication No. Hei 8-275323, contains a circuit-breaker, a disconnector, a grounding switch, a current transformer and a voltage divider in one container, thereby the size of the gas insulating apparatus can be reduced.

However, the above-mentioned method requires the development, design and production of a new device which can contain all devices constituting a gas insulating apparatus and can also satisfy desired design specifications. Accordingly, the cost for the gas insulating apparatus increases. Further, in the above-mentioned method, because locations of a current transformer and a voltage divider are limited to both ends of the circuit-breaker, the protected area of the current transformer and the voltage divider is small. Consequently, for example, a ground fault which has occurred inside the gas insulating apparatus may be determined to have occurred outside the gas insulating apparatus. As a result, the reliability of the gas insulating apparatus is lowered.

DISCLOSURE OF THE INVENTION

One of the objectives of the present invention is to reduce the size of the gas insulating apparatus more than the conventional one. It is preferable that this size reduction does not require the development, design and production of new devices and can be attained by minor improvements or alterations of the devices. Further, another objective of the present invention is to increase the reliability of the gas insulating apparatus.

The fundamental characteristic of the present invention is to combine a sensor portion of the device for measuring either current flowing through the line from the power inlet to the power outlet or voltage of the line, or both, with a bushing provided either at the power inlet or the power outlet, or both. In the present invention, "combination" means that the above-mentioned sensor portion and the bushing are mechanically and functionally combined, so that the measurement of either current or voltage, or both, and either lead-in or lead-out of the power can be conducted by one bushing.

A bushing constitutes a lead-in terminal for leading power from a power transmission line to a gas insulating apparatus or a lead-out terminal for leading power from the gas insulating apparatus to the power transmission line. A bushing usually comprises a porcelain tube, i.e. insulating tube, a current-carrying conductor installed inside the porcelain tube, an electric field relaxation member which is installed inside the porcelain tube facing the outer-periphery side of the current-carrying conductor, an electric field relaxation member installed outside the porcelain tube, and an electrode which electrically connects the current-carrying conductor with another member, for example, an electric wire. Further, some bushings do not have an electric field relaxation member.

In order to combine the sensor portion and the bushing mentioned above, the present invention utilizes space inside the porcelain tube and installs the sensor portion in the space. As space inside the porcelain tube, it is preferable to utilize space on the outer-periphery side of the electric field relaxation member installed inside the porcelain tube. Further, the above-mentioned sensor portion can be installed on the inner-periphery side of the electric field relaxation member installed inside the porcelain tube; in this case, it is preferable to install the sensor portion so that it does not significantly affect the potential distribution. Furthermore, it is possible to install the sensor portion together with the electric field relaxation member installed outside the porcelain tube.

As a sensor portion of a current measuring device, it is preferable to use a current transformer which is a wire-wound annular iron-core member (also called "wire-wound current transformer") or a current transformer which is a wire-wound, annular insulating member (also called "air-core type current transformer" or "Rogowski coil"). As a sensor portion of a voltage measuring device, it is preferable to use a voltage divider which electrostatically divides a current-carrying conductor and grounding, for example, a grounding potential electric field relaxation member. Specifically, it is preferable to use an electrostatic voltage-dividing electrode.

Moreover, there is a well-known bushing which uses space on the outer-periphery side of the electric field relaxation member, for example, disclosed in Japanese Application Patent Laid-Open Publication No. Hei 6-20545. This bushing disclosed in the publication installs a detecting electrode in the space on the outer-periphery side of the intermediate potential electrode so as to electrostatically divide the intermediate potential electrode and a grounding tank thereby detecting the potential of the intermediate potential electrode. Therefore, this is different from the present invention which installs a voltage divider for electrostatically dividing a conductor and an electric field relaxation member on the outer-periphery side of the electric field relaxation member so as to detect current flowing through the conductor.

According to the present invention, combination of the sensor portion and the bushing makes it possible to eliminate a current transformer unit and a voltage transformer unit which are conventionally provided as separate, single units; consequently, the size of the gas insulating apparatus can be reduced. Also, because this combination utilizes space inside the porcelain tube, it is possible to produce the device by making only minor improvements or alterations without the development, design and production of a new device. Thus, the objective can be attained without significantly increasing the cost for producing a gas insulating apparatus.

Further, according to the present invention, combination of the sensor portion and the bushing makes it possible to measure either current or voltage, or both, at the power inlet and the power outlet located at the end of the gas insulating apparatus and, based on the measurements, locate a fault point caused by ground discharge, etc. Thus, it is possible to enlarge the protected area of the device which measures either current or voltage, or both. Consequently, the reliability of the gas insulating apparatus can be increased.

As a method for locating a fault point caused by ground discharge, etc, two methods can be used: a method for comparing measurements at the power inlet and the power outlet and locating the fault point based on the consistency of the polarities; and a method for locating the fault point based on the difference of fault signal measuring time. According to these methods, it is possible to determine whether the fault point caused by ground discharge, etc. is located inside or outside the gas insulating apparatus, or in which portion of the gas insulating apparatus the fault point caused by ground discharge, etc. is located.

Figure 1:
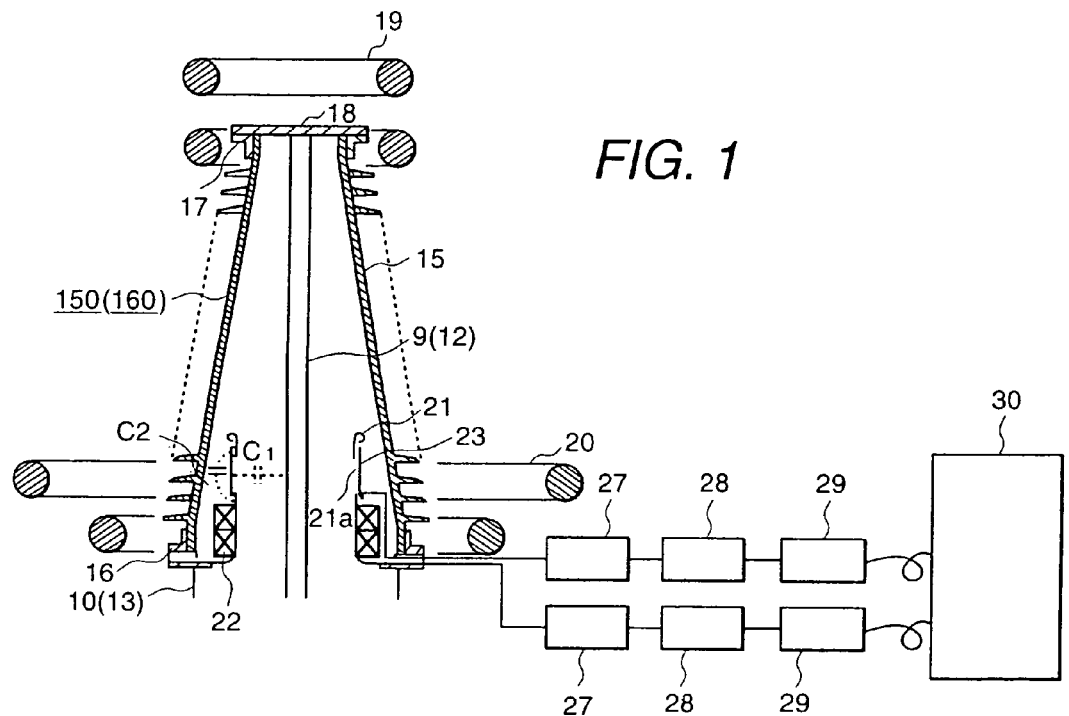
FIG. 1 is a cross-sectional view showing the internal structure of a gas insulating bushing which is a first embodiment of the present invention.
Figure 2:
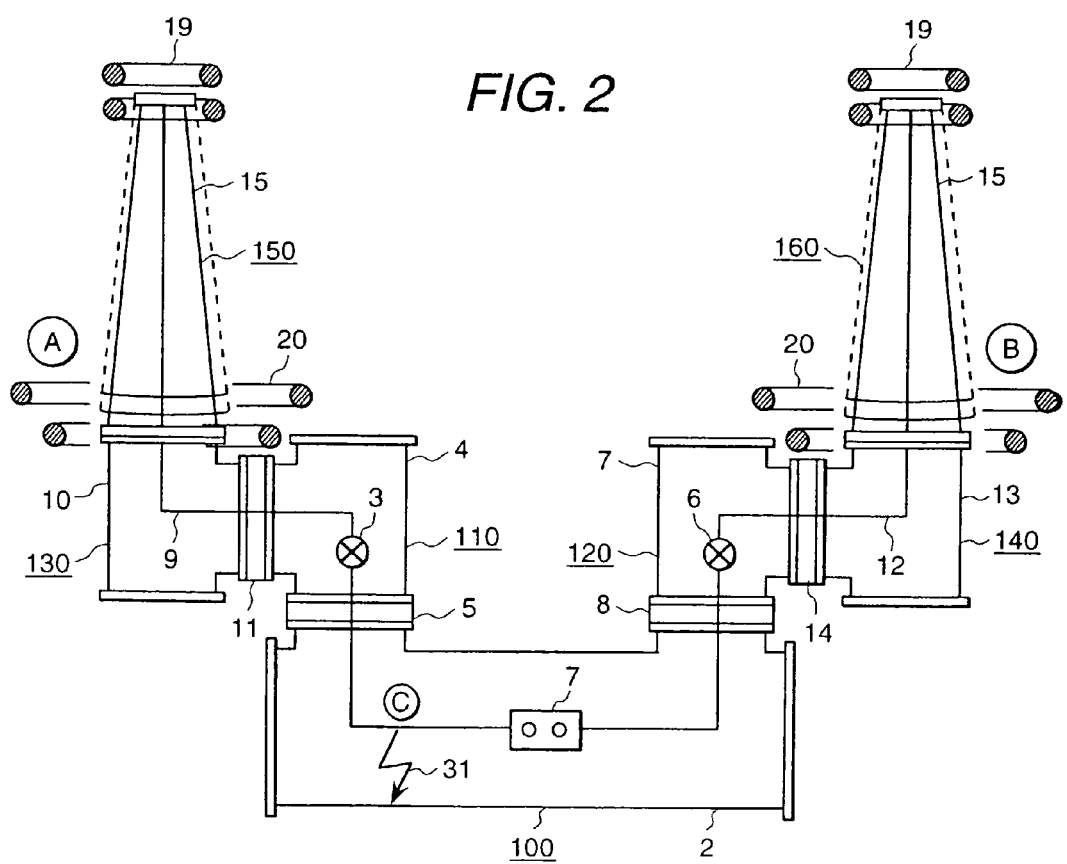
FIG. 2 is an outline drawing which shows the structure of the gas insulation switchgear having a gas insulating bushing shown in FIG. 1 and is combined with a single wiring diagram.

The drawings show third through fifteenth embodiments of the present invention.

DESCRIPTION OF THE PREFERRED EMBODIMENTS (Embodiment 1)

A first embodiment of the present invention will be described with reference to FIG. 1 through FIG. 6. A gas insulation switchgear of this embodiment is a compound switchgear in which an antenna bus, not shown, is electrically connected so as to constitute one phase component. Therefore, in an electric power station, such as an electric power substation, etc., three gas insulation switchgears of this embodiment are arranged side by side in each bay.

In the drawing, there is shown a circuit-breaker unit 100 which is arranged such that a circuit-breaker 1 is contained in a tank 2 filled with $SF_6$ gas (sulfur hexafluoride gas), i.e. an insulating medium. The circuit-breaker 1 has a pair of contacts consisting of a fixed contact and a movable contact, shuts down the fault current by the contacts' opening action, and is operated by a manipulator, not shown. The tank 2 is a grounded, cylindrical metal container.

On one side of the circuit-breaker unit 100, there is provided a disconnector unit 110 which is arranged such that a disconnector 3 is contained in a tank 4 filled with $SF_6$ gas. The disconnector 3 has a pair of contacts consisting of a fixed contact and a movable contact and disconnects a circuit-breaker 1 side circuit and a line A side circuit by the contacts' opening action. The disconnector 3 is also electrically connected to the circuit-breaker 1 via a connecting conductor provided in the insulating spacer 5 and is operated by a manipulator, not shown. The tank 4 is a grounded, T branch-shaped cylindrical metal container and is mechanically connected to the portion branching upward from the peripheral wall of an end side of the tank 2 in the axial direction via an insulating spacer 5.

On the other side of the circuit-breaker unit 100, there is provided a disconnector unit 120 which is arranged such that a disconnector 6 is contained in a tank 7 filled with $SF_6$ gas. The disconnector 6 has a pair of contacts consisting of a fixed contact and a movable contact and disconnects a circuit-breaker 1 side circuit and a line B side circuit by the contacts' opening action. The disconnector 6 is also electrically connected to the circuit-breaker 1 via a connecting conductor provided in the insulating spacer 8 and is operated by a manipulator, not shown. The tank 7 is a grounded, T branch-shaped cylindrical metal container and is mechanically connected to the portion branching upward from the peripheral wall of an end side of the tank 2 in the axial direction via an insulating spacer 8.

On the one side of the disconnector unit 110 which is not the circuit-breaker unit 100 side, there is provided a connecting unit 130 which is arranged such that a current-carrying conductor 9 is contained in a tank 10 filled with $SF_6$ gas. The connecting unit 130 mechanically and electrically connects the disconnector unit 110 and the gas insulating bushing 150. The current-carrying conductor 9, which is a bar-shaped aluminum conductor, is electrically connected to the disconnector 3 via a connecting conductor provided in an insulating spacer 11. The tank 10 is a grounded, T branch-shaped cylindrical metal container and is mechanically connected to the tank 4 via an insulating spacer 11.

On the one side of the disconnector unit 120 which is not the circuit-breaker unit 100 side, there is provided a connecting unit 140 which is arranged such that a current-carrying conductor 12 is contained in a tank 13 filled with $SF_6$ gas. The connecting unit 140 mechanically and electrically connects the disconnector unit 120 and the gas insulating bushing 160. The current-carrying conductor 9, which is a bar-shaped aluminum conductor, is electrically connected to the disconnector 6 via a connecting conductor provided in an insulating spacer 14. The tank 13 is a grounded, T branch-shaped cylindrical metal container and is mechanically connected to the tank 7 via an insulating spacer 14.

On the one side of the connecting unit 130 which is not the disconnector unit 110 side, there is provided a gas insulating bushing 150 to form a power inlet A of the gas insulation switchgear, i.e. a power lead-in terminal. On the one side of the connecting unit 140 which is not the disconnector unit 120 side, there is provided a gas insulating bushing 160 to form a power outlet B of the gas insulation switchgear, i.e. a power lead-out terminal. Both bushings have the same structure.

The structure of the gas insulating bushing of this embodiment will be described hereunder with reference with FIG. 1. A gas insulating bushing 150(160) is arranged such that a current-carrying conductor 9(12) extending from the connecting unit 130(140) is disposed on the central axis of a porcelain tube 15 filled with $SF_6$ gas. The porcelain tube 15 is a conical trapezoid insulating tube (porcelain) wherein a plurality of drape-like protruding portions are formed on the outer-periphery side thereof.

Herein, "conical trapezoid" means a solid shape which, when a cone is cut by a plane horizontally to the bottom surface, appears between the cut surface and the bottom surface. In other word, "conical trapezoid" means a solid shape in which the plane horizontally to the bottom surface becomes larger from the upper surface side toward the bottom surface side in similar figures.

A flange member 17 is fixed to the upper-end portion of the porcelain tube 15 with adhesives. The flange member 17 is an annular metal member. An electrode 18 is mechanically connected to the flange member 17. The electrode 18 is a disk-shaped metal member, and a current-carrying conductor 9(12) is electrically connected to the electrode's porcelain tube 15 side surface, while a lead-in wire (not shown) pulled from an antenna bus is electrically connected to the electrode's opposite side surface. An external shield 19 is provided on the upper-end side of the porcelain tube 15. An external shield 20 is provided on the lower-end side of the porcelain tube 15. External shields 19, 20 are composed of a plurality of annular aluminum members stacked together and are electric field relaxation members that surround the upper and lower-end sides of the porcelain tube 15.

An internal shield 21 is provided on the lower-end side inside the porcelain tube 15. The internal shield 21 is a cylindrical aluminum member which relaxes the electric field in the vicinity of the boundary between the lower-end portion of the porcelain tube 15 and a tank 10(13), and is disposed facing the outer-periphery side of the current-carrying conductor 9(12) so as to surround the current-carrying conductor 9(12) which is extending upward from the vicinity of the boundary mentioned above. The lower-end portion of the internal shield 21 is bent outward roundly at right angle and is sandwiched between a flange member 16 and a flange portion of the tank 10(13). This arrangement supports and grounds the internal shield 21. The upper-end portion of the internal shield 21 is bent outward circularly. This arrangement relaxes the electric field on the upper-end side of the internal shield 21.

In space on the outer-periphery side of the internal shield 21, i.e. a space portion between the internal shield 21 and the porcelain tube 15, there is provided a current transformer 22 and a voltage divider 23. The current transformer 22 is a component of a sensor portion (or detecting portion) of a current measuring device. The voltage divider 23 is a component of a sensor portion (or detecting portion) of a voltage measuring device.

An air-core type current transformer which is an insulating wire-wound annular insulating member (also called "Rogowski coil") or a wire-wound current transformer which is an insulating wire-wound wing-like iron-core member is used for the current transformer 22. An air-core type current transformer is more easily handled than a wire-wound current transformer because it is lighter than the wire-wound current transformer and has no magnetic saturation. Further, an optical fiber sensor can be used instead of the current transformer 22.

A voltage divider 23 is a voltage-dividing electrode which electrostatically divides the internal shield 21 having a ground potential and the current-carrying conductor 9(12). The voltage-dividing electrode, which is a cylindrical metal (aluminum) member, is disposed on the outer-periphery wall of the internal shield 21 via an insulating member 24 facing the current-carrying conductor 9(12) via through-holes 21a in the internal shield 21. This arrangement forms $C_1$ between the current-carrying conductor 91(12) and the voltage divider 23 and $C_2$ between the voltage divider 23 and the internal shield 21.

FIGS. 5(a) through (d) show the examples of the internal shield 21 and the voltage divider 23. In an example shown in FIG. 5(a), a plurality of rectangle through-holes 21a are formed in the peripheral wall of the internal shield 21, and an insulating member 24 is provided on the outer-periphery wall of the internal shield 21 so as to close the openings of the through-holes 21a, and the voltage divider 23 is provided on the outer-periphery side of the insulating member 24. The through-holes 21a divide the internal shield 21 into the upper portion 21b and the lower portion 21c, and those portions are mechanically connected by a plurality of supports 21d.

Figure 5A:
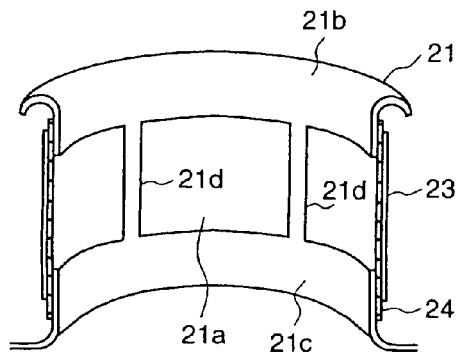
FIG. 5 is a perspective cross-sectional view showing the structure of an internal shield and a voltage divider which are component members of the gas insulating bushing shown in FIG. 1. The drawing shows four structures (a) to (d).
Figure 5B:
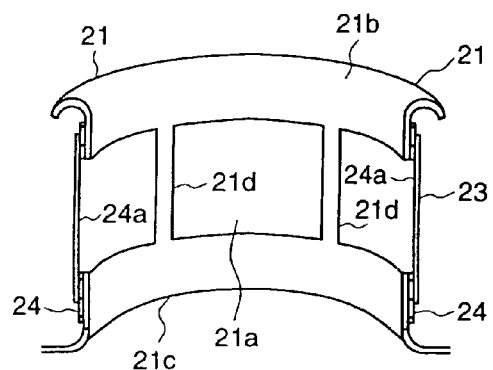

FIG. 5(b) is an improved example of the one shown in FIG. 5(a). Through-holes 24a as big as through-holes 21a are formed in the insulating member 24. That is, the insulating member 24 is to electrically insulate the internal shield 21 and the voltage divider 23 and support the voltage divider 23 on the outer-periphery wall of the internal shield 21. Therefore, it is not necessary for the insulating member 24 to close the openings of the through-holes 21a. According to the above-mentioned examples shown in FIG. 5(a) and (b), a voltage divider 23 can be provided on the outer-periphery wall of the internal shield 21 as an intermediate potential electrode between the internal shield 21 having a ground potential and the current-carrying conductor 9(12). Consequently, the internal shield 21 and the current-carrying conductor 9(12) can be electrostatically divided.

Further, although the voltage divider 23 can be installed without having an insulating member 24, in order to prevent measurement accuracy from decreasing due to changes of electrostatic capacities $C_1$ and $C_2$ caused by heat and vibration, it is preferable to have an insulating member 24 as shown in FIG. 5(a) and (b). Furthermore, the voltage-dividing ratio of the voltage divider 23 can be freely changed by changing the electrostatic capacity $C_2$ or $C_1$ by changing the thickness of the insulating member 24 thereby changing its dielectric constant.

Figure 5C:
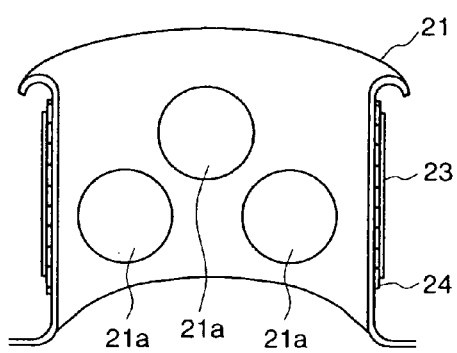

In an example shown in FIG. 5(c), through-holes 21a are formed by drilling the peripheral wall of the internal shield 21 and are different from the through-holes shown in FIG. 5(a) and (b) which are assembled by parts. Current flowing through the current-carrying conductor 9(12) generates an electromagnetic force and the force is applied to the internal shield 21. Accordingly, if the mechanical strength of the internal shield 21 is insufficient, it may be damaged by the force.

For the above reasons, in this example, the through-holes 21a are made by drilling the peripheral wall of the internal shield 21 so as to prevent the mechanical strength of the internal shield 21 from greatly decreasing. According to the example shown in FIG. 5(c), it is possible to increase reliability of the gas insulating bushing. Moreover, it is not necessary to close the openings of the through-holes 21a by the insulating member 24.

Figure 5D:
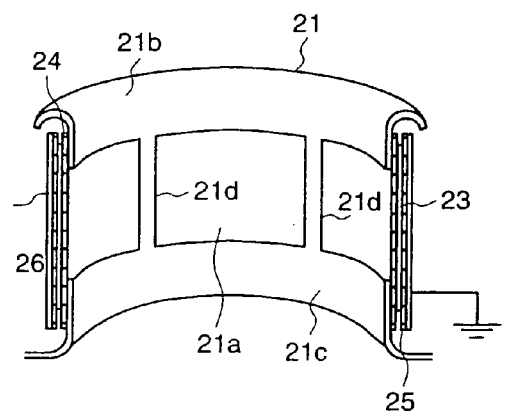
Figure 6:
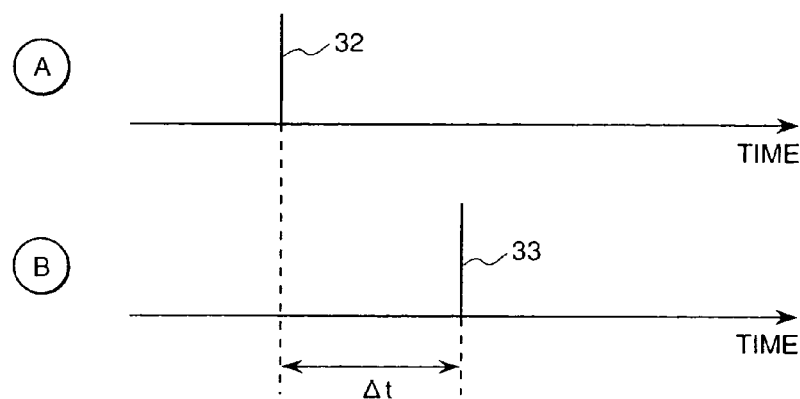
FIG. 6 is a time chart that explains a method for locating a ground fault.

FIG. 5(d) is an improved example of the one shown in FIG. 5(a). Herein, a shielding member 26 is provided on the outer-periphery side of the voltage divider 23 via an insulating member 25. The shielding member 26 is a grounded, cylindrical metal (aluminum) member and is the same size as the voltage divider 23 or lager. The insulating member 25 is used for electrically insulating the voltage divider 23 from the shielding member 26.

In the above-mentioned examples shown in FIG. 5(a), (b) and (c), there is a possibility of decrease in measurement accuracy due to the effect of electrostatic induction from outside. As effects of electrostatic induction, for example, changes of an electrostatic capacity $C_2$ due to the tank 10(13) having a ground potential, changes of voltage distributions of the porcelain tube 15 due to rain and dirt, and induction by different phase bushing and sheath current can be expected. Therefore, the above-mentioned arrangement of this example can suppress the effect of electrostatic induction. Consequently, according to the example shown in FIG. 5(d), reliability of the gas insulating bushing can be increased.

Figure 3:
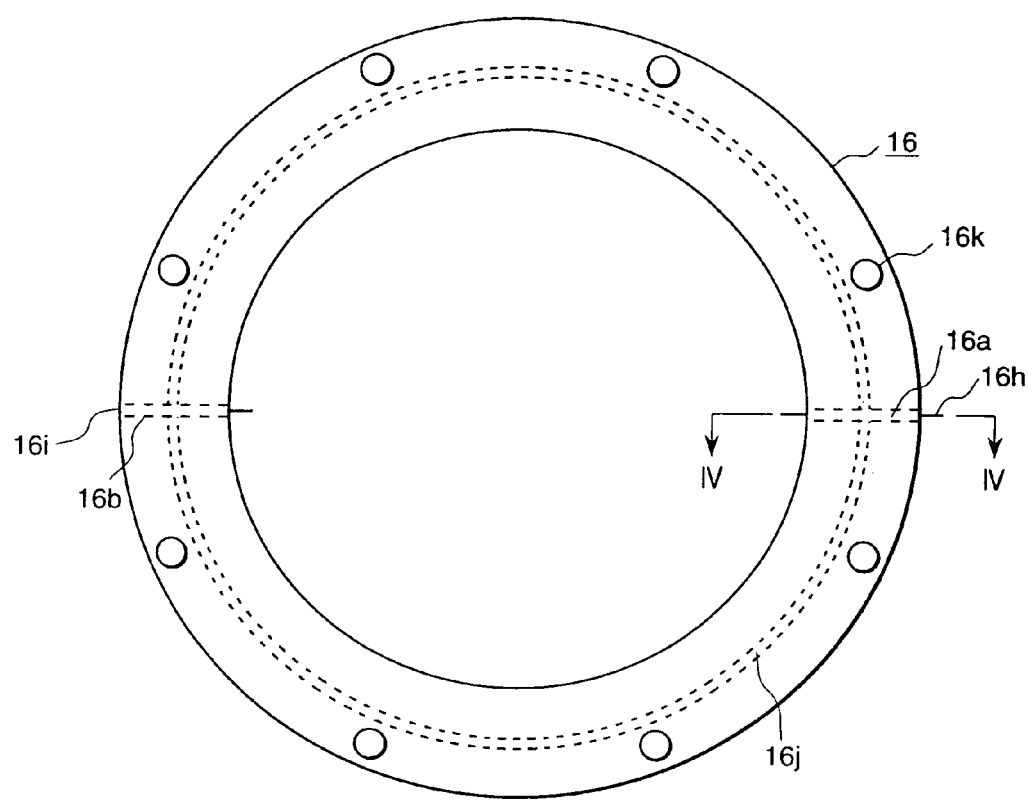
FIG. 3 is a plan view showing the structure of a flange member which is a component member of the gas insulating bushing shown in FIG. 1.
Figure 4:
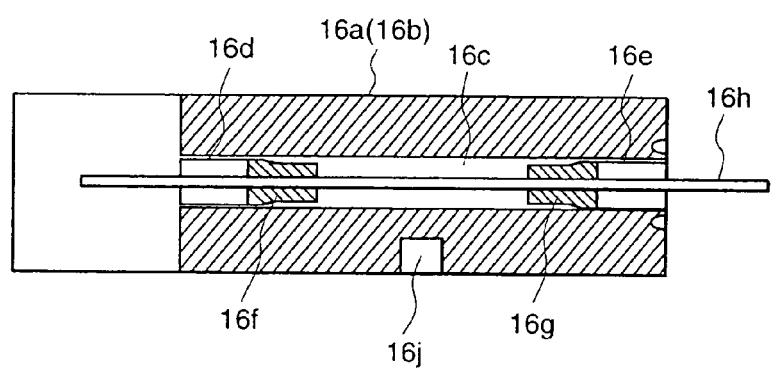
FIG. 4 is a IV—IV auxiliary cross-sectional view of FIG. 3.

A flange member 16 is fixed to the lower-end portion of the porcelain tube 15 with adhesives. The flange member 16 is an annular metal member and is mechanically connected to the flange portion of the tank 10(13). The flange member 16 has signal take-out portions 16a, 16b. The signal take-out portions 16a, 16b are arranged so as to take out current and voltage signals detected by a current transformer 22 and a voltage divider 23 and are provided diametrically facing each other on the line (diametric line) which passes through the center point of the flange member 16. Both portions have the same structure which is shown in FIG. 3 and FIG. 4.

A signal take-out portion 16a(16b) consists of a cylindrical through-hole 16c penetrating into the outer-periphery wall side of the flange member 16 from the inner-periphery wall side, a sleeve 16d welded to one end side (inner-periphery wall side of the flange member 16) of the through-hole 16c, a sleeve 16e welded to the other end side (outer-periphery wall side of the flange member 16) of the through-hole 16c, an insulator 16f brazed to the sleeve 16e side end portion of the sleeve 16d, an insulator 16g brazed to the sleeve 16d side end portion of the sleeve 16e, and a pin 16h(16i) penetrating the central portion of the sleeves 16d, 16e.

The sleeves 16d, 16e are cylindrical iron-nickel-cobalt alloy members and nickel plated. The insulators 16f, 16g are ceramic insulating members mainly made of alumina and are solid cylindrical members. The pin 16h(16i) is a round bar-shaped iron-nickel-cobalt alloy member, nickel plated, and is a conductive member extending from the inner-periphery side of the flange member 16 to the outer-periphery side.

A groove 16j is provided on the lower wall surface of the flange member 16. The groove 16j is an annular groove with a rectangle section. A sealing member, for example, an O-ring fits into the groove 16j. A plurality of bolt holes 16k are provided at a given space in the periphery portion of the flange member 16. The porcelain tube 15 and the tank 10(13) are mechanically connected by inserting bolts into the bolt holes 16k and tightening them.

A filter 27 is electrically connected to the current transformer 22 and the voltage divider 23 via the pin 16h(16i). The filter 27 removes signal components of high-frequency surge contained in analog signals output from the current transformer 22 and the voltage divider. The filter 27 is electrically connected to the signal processing unit 28. The signal processing unit 28 digitally processes analog signals output from the filter 27.

The signal processing unit 28 is electrically connected to an E/O converter 29.

The E/O converter 29 converts digital electric signals output from the signal processing unit 28 into optical signals. A supervisory control device 30 is connected to the E/O converter 29 via an optical cable. Based on the optical signal output from the E/O converter 29, the supervisory control device 30 obtains current and voltage values, displays the values, outputs operating signals of the circuit-breaker based on the values, and also locates a ground fault point.

Now, the current and voltage measuring action will be described. When current flows though the current-carrying conductor 9(12), a magnetic flux is generated around the current-carrying conductor 9(12) and a potential is generated between the current-carrying conductor 9(12) and the internal shield 21. In the current transformer 22, current flows through the wire due to the generated magnetic flux and a current detecting signal is output, while in the voltage divider 23, the generated potential is electrostatically divided and a voltage detecting signal is output.

The current and voltage detecting signals are input into the filter 27, thereby signal components of the high-frequency surge are removed. Current and voltage detecting signals free from high-frequency surge signal components are input into the signal processing unit 28 and then digitally processed. The digitally processed current and voltage signals are input into the E/O converter 29 and converted into optical signals. The optical current and voltage signals are input into the supervisory control device 30 via an optical cable, and based on the signals, current and voltage values are computed.

Next, a method for locating a ground fault point will be described. If a ground discharge 31 occurs at location C in the gas insulation switchgear due to the intrusion of foreign substances, the applied voltage becomes zero, thereby pulse voltage is generated and ground-fault pulse currents 32, 33 flow from location C to both directions. The voltage and the current are detected by sensors (the current transformer 22 and the voltage divider 23) installed in the gas insulating bushing 150(160). Thus, a ground fault signal is output from the above-mentioned sensors.

In the same manner as the current and voltage measuring action mentioned above, the output ground fault signal is input into the supervisory control device 30 via a filter 27, a signal processing unit 28, an E/O converter 29 and an optical cable. By doing so, the supervisory control device 30 locates the ground fault point based on the input ground fault signals.

As a method for locating a ground fault point, two methods are used: a method based on the consistency of the polarities of the ground fault signals detected and output by the gas insulating bushing 150 sensor and the gas insulating bushing 160 sensor, and a method based on the difference $\Delta t$ of the ground fault measuring time.

In the former method, it is possible to determine whether the ground fault has occurred inside or outside the gas insulation switchgear. That is, when polarities of the ground fault signal detected and output by the gas insulating bushing 150 sensor coincides with that of the ground fault signal detected and output by the gas insulating bushing 160 sensor, it can be determined that the ground fault has occurred outside the gas insulation switchgear (power transmission line side ground fault caused by flash-to-ground, etc.), while the polarities do not coincide with each other, it can be determined that the ground discharge has occurred inside the gas insulation switchgear (device side ground fault caused by intrusion of foreign substances, etc.).

In the latter method, if the ground fault has occurred inside the gas insulation switchgear, it is possible to find in which portion of the gas insulation switchgear the ground fault has occurred. For example, if the difference Δt of the ground fault measuring time is zero (0), it can be determined that the ground fault has occurred at a location where the distance from the gas insulating bushing 150 sensor is equal to the distance from the gas insulating bushing 160 sensor.

According to this embodiment mentioned above, the current transformer 22 and the voltage divider 23 are installed in the space on the outer-periphery side of the internal shield 21, i.e. a space portion between the porcelain tube 15 and the internal shield 21, so as to measure current flowing through the current-carrying conductor 9(12) and voltage; therefore, the current transformer unit and the voltage transformer unit which are conventionally provided as separate, single units can be omitted. Accordingly, the size of the gas insulation switchgear can be reduced.

Further, because this size reduction utilizes space in the gas insulating bushing 150(160), i.e. a space portion between the porcelain tube 15 and the internal shield 21, it is possible to produce the device by making only minor improvements or alterations without the development, design and production of a new device. Further, different from conventional devices, it is not necessary to separately produce a gas insulating bushing, a current transformer and a potential divider. Consequently, the cost for producing a gas insulation switchgear will not greatly have to be increased.

Furthermore, in this embodiment, the example where the current transformer 22 and the voltage divider are installed in the space portion between the porcelain tube 15 and the internal shield 21 has been described, however, it is also possible to only provide either the current transformer 22 or the voltage divider 23 in the above-mentioned space portion.

Moreover, according to this embodiment, because the current transformer 22 and the voltage divider are installed in the space portion between the porcelain tube 15 and the internal shield 21, potential distributions of the gas insulating bushing 150(160) while current is flowing do not change significantly depending on the current transformer 22 and the voltage divider 23. Accordingly, changes of potential do not significantly lower the dielectric strength of the gas insulating bushing.

Further, because the distance from the current-carrying conductor to the space portion between the porcelain tube 15 and the internal shield 21 is shortest in the gas insulation switchgear, the magnetic flux density caused by electric conduction is high and the potential is also high. Therefore, according to this embodiment, it is possible to increase measurement accuracy of the current transformer 22 and the voltage divider 23 installed in the above-mentioned space portion. Furthermore, due to the improvement of the measurement accuracy, the size of the current transformer 22 and the voltage divider 23 can be reduced.

Moreover, according to this embodiment, because the current transformer 22 and the voltage divider are installed in the gas insulating bushing 150(160) which is provided at the power inlet and the power outlet located at the end of the gas insulation switchgear, it is possible to enlarge the protected area of the current transformer 22 and the voltage divider 23. Accordingly, when locating a ground fault point based on the detecting signals sent from the current transformer 22 and the voltage divider 23, it is possible to more accurately determine whether the ground fault has occurred inside or outside the gas insulation switchgear than conventional methods. As a result, reliability of the gas insulation switchgear can be increased.

Moreover, since it is easier to more accurately determine whether the ground fault has occurred inside or outside the gas insulation switchgear than using conventional methods, the work load on maintenance inspection workers in an electric power substation and maintenance inspection costs can be reduced. That is, when a ground fault has occurred, maintenance inspection workers had to be assigned to either the device side or the power transmission line side to conduct inspections so as to locate the ground fault point. Because of this reason, when a ground fault has occurred inside the gas insulation switchgear, if the ground fault is located to have occurred on the power transmission line side, maintenance inspection workers on the power transmission line side have to inspect the power transmission line although the ground fault actually occurred on the device side. This increases the work load on the maintenance inspection workers as well as maintenance inspection costs. On the other hand, according to this embodiment, it is possible to determine whether the ground fault has occurred inside or outside the gas insulation switchgear more accurately than conventional methods. Consequently, the work load on maintenance inspection workers in an electric power substation and maintenance inspection costs can be reduced.

(Embodiment 2)

Figure 7:
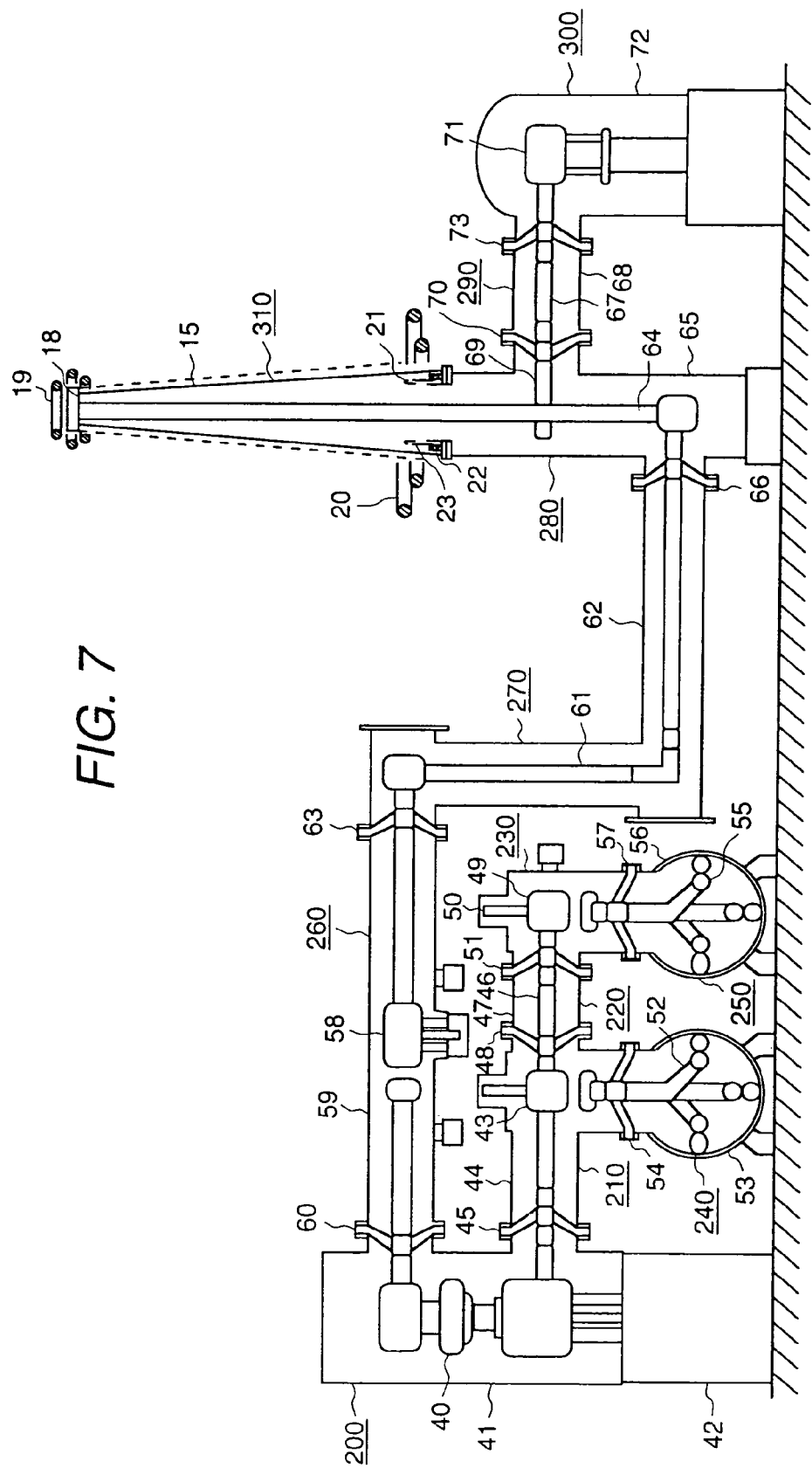
FIG. 7 is a cross-sectional view showing the structure of a gas insulation switchgear which is a second embodiment of the present invention.

A second embodiment of the present invention will now be described with reference to FIG. 7. A gas insulation switchgear of this embodiment is a switchgear arranged such that a gas insulating bus is a three-phase package type and other portions are phase separation types, and provided, for example, as a low-pressure side switchgear in an electric power substation.

In the drawing, there is shown a circuit-breaker unit 200 which is arranged such that a circuit-breaker 40 is contained in a tank 41 filled with $SF_6$ gas, i.e. an insulating medium. The circuit-breaker 40 has a pair of contacts consisting of a fixed contact and a movable contact, shuts down the fault current by the contacts' opening action, and is operated by a manipulator 42 provided at the lower portion of the tank 41. The tank 41 is a grounded, cylindrical metal container.

On one lower-end side of the circuit-breaker unit 200, there is provided a disconnector unit 210 which is arranged such that a disconnector 43 is contained in a tank 44 filled with $SF_6$ gas. The disconnector 43 has a pair of contacts consisting of a fixed contact and a movable contact, disconnects a circuit-breaker 40 side circuit and a bus 52 side circuit by the contacts' opening action. The disconnector 43 is also electrically connected to the circuit-breaker 40 via a connecting conductor provided in the insulating spacer 45, and is operated by a manipulator, not shown. The tank 44 is a grounded, T branch-shaped cylindrical metal container and is mechanically connected to the horizontally branching lower-end side peripheral wall portion of the tank 41 via an insulating spacer 45.

On the one side of the disconnector unit 210 which is not the circuit-breaker unit 200 side, there is provided a connecting unit 220 which is arranged such that a current-carrying conductor 46 is contained in a tank 47 filled with $SF_6$ gas. The connecting unit 220 mechanically and electrically connects the connector unit 210 and the disconnector unit 230. The current-carrying conductor 46, which is a bar-shaped aluminum conductor, is electrically connected to the disconnector 43 via a connecting conductor provided in an insulating spacer 48. The tank 47 is a grounded, cylindrical metal container and is mechanically connected to the horizontally extending portion of the tank 44.

On the one side of the connecting unit 220 which is not the disconnector unit 210 side, there is provided a disconnector unit 230 which is arranged such that a disconnector 49 is contained in a tank 50 filled with $SF_6$ gas. The disconnector 49 has a pair of contacts consisting of a fixed contact and a movable contact and disconnects a circuit-breaker 40 side circuit and a bus 55 side circuit by the contacts' opening action. The disconnector 49 is also electrically connected to the connecting conductor 46 via a connecting conductor provided in the insulating spacer 51 and is operated by a manipulator, not shown. The tank 50 is a grounded, L-shaped cylindrical metal container and is mechanically connected to the tank 47 via an insulating spacer 51.

On the one side of the disconnector unit 210 which is not the circuit-breaker unit 200 side, there is provided a bus unit 240 which is arranged such that three-phase components of the bus 52 are contained in a tank 53 filled with $SF_6$ gas. The bus 52 is disposed in the tank 53 so that each component thereof is located at each point of a triangle, and is electrically connected to the disconnector 43 via a connecting conductor disposed in the insulating spacer 54. The tank 53 is a grounded, cylindrical metal container and is mechanically connected to the portion of the peripheral wall of the tank 44 branching downward via the insulating spacer 54.

On the one side of the disconnector unit 230 which is not the connecting unit 220 side, there is provided a bus unit 250 which is arranged such that three-phase components of the bus 55 are contained in a tank 56 filled with $SF_6$ gas. The bus 55 is disposed in the tank 56 so that each component thereof is located at each point of a triangle, and is electrically connected to the disconnector 49 via a connecting conductor provided in the insulating spacer 57. The tank 56 is a grounded, cylindrical metal container and is mechanically connected to the portion of the tank 50 branching downward via the insulating spacer 57. Both bus units have the same structure.

On one upper-end side of the circuit-breaker unit 200, there is provided a disconnector unit 260 which is arranged such that a disconnector 58 is contained in a tank 59 filled with $SF_6$ gas. The disconnector 58 has a pair of contacts consisting of a fixed contact and a movable contact and disconnects a circuit-breaker 40 side circuit and a line side circuit by the contacts' opening action. The disconnector 58 is also electrically connected to the circuit-breaker 40 via a connecting conductor provided in the insulating spacer 60 and is operated by a manipulator, not shown. The tank 59 is a grounded, cylindrical metal container and is mechanically connected to the horizontally branching upper-end side peripheral wall portion of the tank 41 via an insulating spacer 60.

On the one side of the disconnector unit 260 which is not the circuit-breaker unit 200 side, there is provided a connecting unit 270 which is arranged such that a current-carrying conductor 61 is contained in a tank 62 filled with $SF_6$ gas. The connecting unit 270 mechanically and electrically connects the disconnector unit 260 and the connecting unit 280. The current-carrying conductor 61, which is a bar-shaped aluminum conductor, is electrically connected to the disconnector 58 via a connecting conductor provided in an insulating spacer 63. The tank 62 is a grounded, L-shaped cylindrical metal container and is mechanically connected to the tank 59 via an insulating spacer 63.

On the one side of the connecting unit 270 which is not the disconnector unit 260 side, there is provided a connecting unit 280 which is arranged such that a current-carrying conductor 64 is contained in a tank 65 filled with $SF_6$ gas. The connecting unit 280 mechanically and electrically connects the connecting unit 270, the gas insulating bushing 310, and the connecting unit 290. The current-carrying conductor 64, which is a bar-shaped aluminum conductor, is electrically connected to the current-carrying conductor 61 via a connecting conductor provided in an insulating spacer 66. The tank 65 is a grounded, cylindrical metal container and is mechanically connected to the tank 62 via an insulating spacer 66.

On the one side of the connecting unit 280 which is not the connecting unit 270 side, there is provided a connecting unit 290 which is arranged such that a current-carrying conductor 67 is contained in a tank 68 filled with $SF_6$ gas. The connecting unit 290 mechanically and electrically connects the connecting unit 280 and the lightning-arrester unit 300. The current-carrying conductor 67, which is a bar-shaped aluminum conductor, is electrically connected to the current-carrying conductor 64 via a connecting conductor and a branch conductor 69 provided in an insulating spacer 70. The tank 68 is a grounded, cylindrical metal container and is mechanically connected to the tank 65 via an insulating spacer 70.

On the one side of the connecting unit 290 which is not the connecting unit 280 side, there is provided a lightning-arrester unit 300 which is arranged such that a lightning-arrester 71 is contained in a tank 82 filled with $SF_6$ gas. The lightning-arrester 71, which is composed of a plurality of laminated zinc oxide elements mainly made of ZnO, suppresses the over-voltage of the gas insulation switchgear, and is electrically connected to the current-carrying conductor 67 via a connecting conductor provided in an insulating spacer 73. The tank 72 is a grounded, metal storage container and is mechanically connected the tank 68 via the insulating spacer 73.

On the one side of the connecting unit 280 which is not the connecting unit 270 side, there is provided a gas insulating bushing 310 which is arranged such that a current-carrying conductor 64 continually extending from the connecting unit 280 is contained in a porcelain tube 15 filled with $SF_6$ gas. This arrangement constitutes the power outlet of the gas insulation switchgear, i.e. a power lead-out terminal. The structure of the gas insulating bushing 310 according to this embodiment is the same as that of the gas insulating bushing according to the first embodiment. Therefore, detailed description of the gas insulating bushing 310 will be omitted.

Furthermore, in this embodiment, although a gas insulation switchgear installed on the high-pressure side is not shown, a gas insulating bushing is also installed at the power inlet of the gas insulation switchgear. In this embodiment, the structure of the gas insulating bushing used to constitute the power lead-in terminal is the same as that of the gas insulating bushing according to the first embodiment described above.

As described above, because this embodiment employs the same gas insulating bushing as the first embodiment, the same result as the first embodiment can be expected. Moreover, in this embodiment, a ground fault point can be determined based on the detecting signals from the gas insulating bushing installed in the high-pressure side gas insulation switchgear and from the gas insulating bushing installed in the low-pressure side gas insulation switchgear.

(Embodiment 3)

Figure 8:
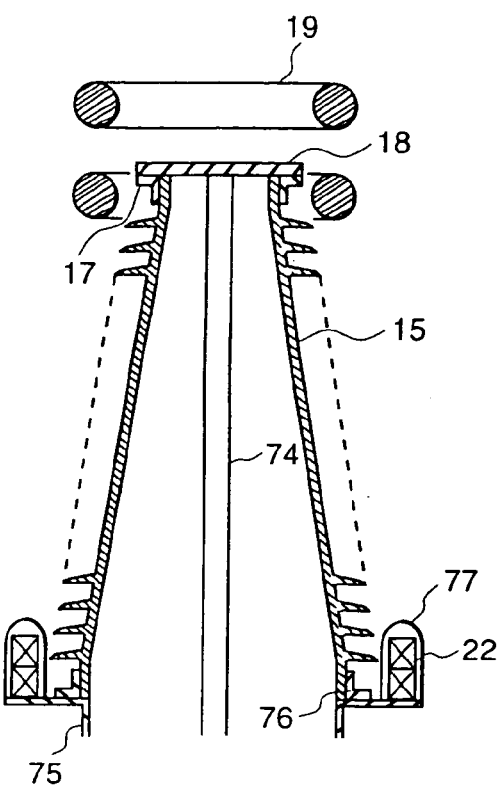
FIG. 8 through FIG. 20 are cross-sectional views of the internal structure of the gas insulating bushing installed in the gas insulation switchgear.

A third embodiment of the present invention will be described with reference to FIG. 8. This drawing shows the structure of the gas insulating bushing only; the entire structure of the gas insulation switchgear is not shown. Further, the gas insulating bushing of this embodiment includes the gas insulation switchgear according to the first and second embodiments mentioned above, and is applicable to all gas insulation switchgears having a gas insulating bushing at a power inlet or a power outlet.

In this embodiment, a large flange portion of a tank 75 is formed on the outer-periphery side and an annular metal (aluminum) container 77 is installed thereon. The container 77 contains a current transformer 22. The container 77, which is grounded and installed so as to surround the lower-end side periphery of the porcelain tube 15, can relax the electric field as the external shield can. Further, this embodiment eliminates an internal shield and relaxes the electric field of the lower-end side of the porcelain tube 15 only by the container 77.

Moreover, in this embodiment, because a current transformer 22 is installed outside the porcelain tube 15, a flange member 76 fixed to the lower-end portion of the porcelain tube 15 does not have such a signal take-out portion as provided in the previous embodiment, but is shaped similar to the flange member 17 fixed to the upper-end portion of the porcelain tube 15. The structure of other parts is the same as the previous embodiment, therefore, their description will be omitted here.

As described above, according to this embodiment, a current transformer 22 in the container 77 is installed in the flange portion of the tank 75 so as to measure current flowing through the current-carrying conductor 74. This arrangement does not require a current transformer unit which is conventionally provided as a single unit. Consequently, the size of the gas insulation switchgear can be reduced. In addition to this, if a voltage divider for measuring voltage of the current-carrying conductor 74 is installed, the transformer unit which is conventionally provided as a single unit can be eliminated. As a result, the size of the gas insulation switchgear can be significantly reduced.

Further, according to this embodiment, because the current transformer 22 is installed outside the porcelain tube 15, it is easy to conduct maintenance, inspections and replacement of the current transformer 22, thereby the maintenance efficiency of the gas insulation switchgear can be increased. Moreover, in this embodiment, the example where the current transformer 22 is contained in the container 77 has been described, however, it is also possible to form storage space in the external shield and contain the current transformer 22 therein.

(Embodiment 4)

Figure 9:
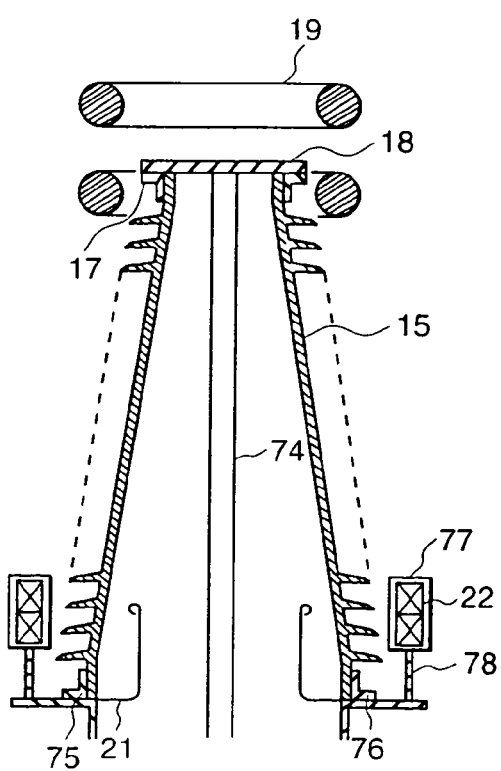
Figure 10:
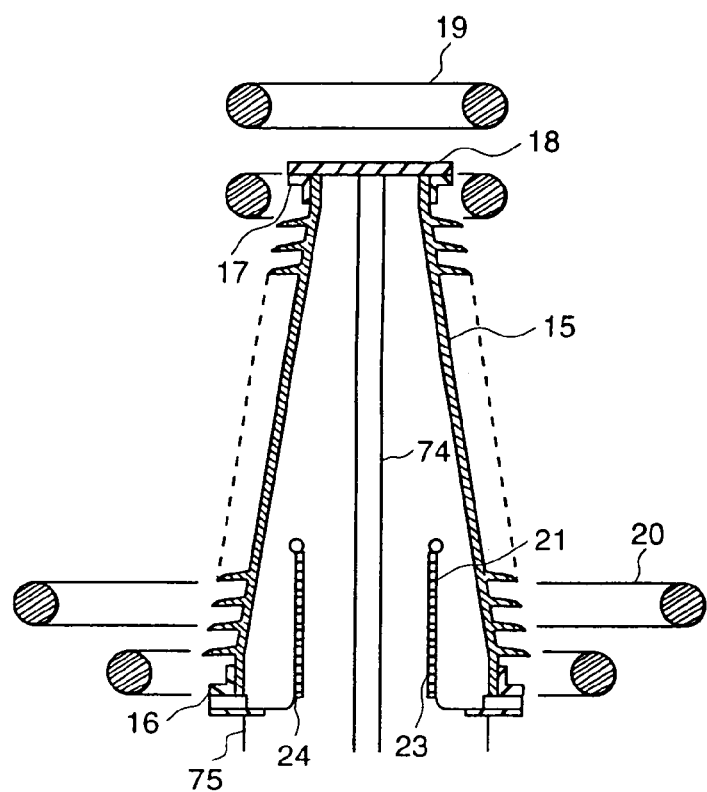

A fourth embodiment of the present invention will be described with reference to FIG. 9. The gas insulating bushing of this embodiment is an altered example of the third embodiment and has an internal shield 21. In this case, it is necessary to adjust positions of the internal shield 21 and the container 77 so as to relax the electric field. In this embodiment, the container 77 is lifted by a stand 78 so that the upper tip of the container 77 protrudes above the upper tip of the internal shield 21 in order to relax the electric field. According to this embodiment, the same effect as the third embodiment can be expected, and also relaxation of the electric field can be performed as in the same manner as previous embodiments.

(Embodiment 5)

Figure 11:
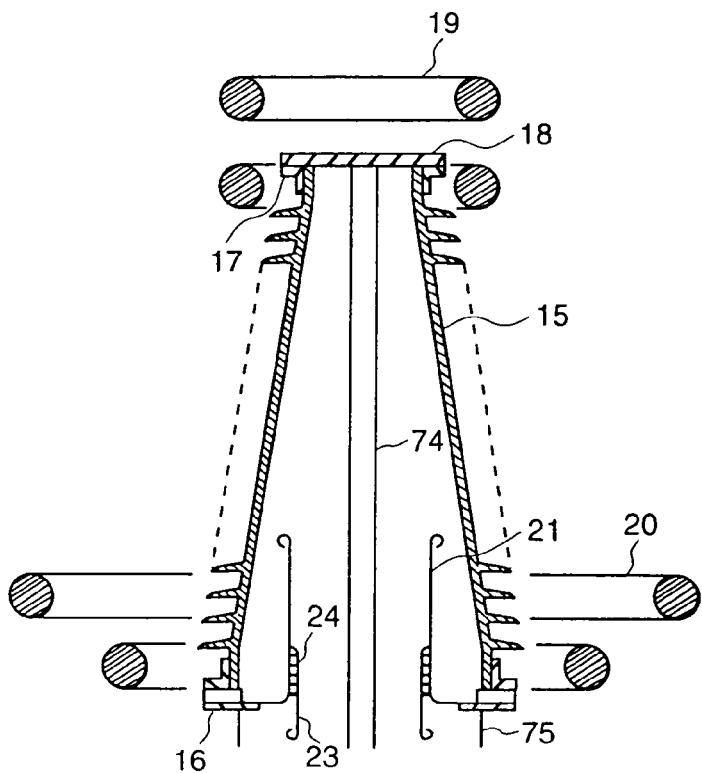

A fifth embodiment of the present invention will be described with reference to FIG. 11. This drawing shows the structure of the gas insulating bushing only; the entire structure of the gas insulation switchgear is not shown. Further, the gas insulating bushing of this embodiment includes the gas insulation switchgear according to the first and second embodiments mentioned above, and is applicable to all gas insulation switchgears having a gas insulating bushing at a power inlet or a power outlet.

In this embodiment, a voltage divider 23, i.e. a cylindrical voltage-dividing electrode is installed on the inner-periphery side of the internal shield 21 via an insulating member. This arrangement electrostatically divides the current-carrying conductor 74 and the internal shield 21. Further, in this embodiment, the inner diameter of the internal shield 21 is made large due to the thickness of the voltage divider 23 and the insulating member 24. Other parts are the same as the previous embodiment, therefore, their description will be omitted here.

As described above, according to this embodiment, the voltage divider 23 is installed on the inner-periphery side of the internal shield 21 via an insulating member 24 to measure voltage of the current-carrying conductor 74. This arrangement does not require a current transformer unit which is conventionally provided as a single unit. Consequently, the size of the gas insulation switchgear can be reduced. Further, in addition to this, if a current transformer for measuring current flowing through the current-carrying conductor 74, a current transformer unit which is conventionally provided as a single unit can be eliminated. As a result, the size of the gas insulation switchgear can be significantly reduced.

Furthermore, according to this embodiment, because the inner diameter of the internal shield 21 is made large due to the thickness of the voltage divider 23 and the insulating member 24, potential distributions while current is flowing do not significantly change depending on the voltage divider 23 protruding toward the inner-periphery side of the internal shield 21 and the insulating member 24. Consequently, changes of the potential distribution do not significantly decrease the dielectric strength of the gas insulating bushing.

(Embodiment 6)

A sixth embodiment of the present invention will be described with reference to FIG. 11. The gas insulating bushing of this embodiment is an altered example of the fifth embodiment, wherein a voltage divider 23 is installed on the inner-periphery side of the internal shield 21 via an insulating member 24 and the lower-tip portion thereof protrudes below the lower-end portion of the internal shield 21 and is bent circularly outside. According to this embodiment, the same effect as the fifth embodiment can be expected.

(Embodiment 7)

Figure 12:
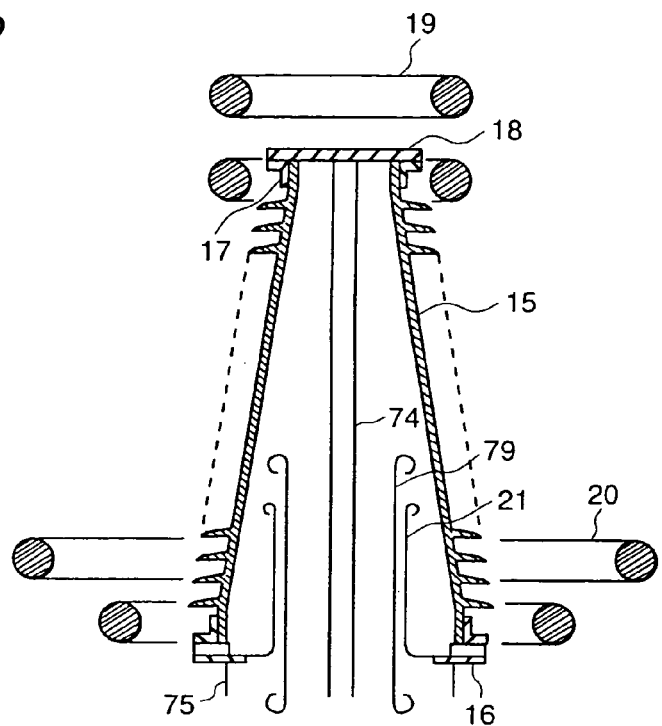

A seventh embodiment of the present invention will be described with reference to FIG. 12. The gas insulating bushing of this embodiment is an altered example of the fifth embodiment, wherein a voltage divider is arranged such that an intermediate potential electrode 79 is installed with a given space on the inner-periphery side of the internal shield 21. The intermediate potential electrode 79 is cylindrical, and the upper and lower tip portions thereof protrude above and below the upper and lower end portions of the internal shield 21 and are bent circularly outward. According to this embodiment, the same effect as the fifth embodiment can be expected. Moreover, depending on the shape of the intermediate potential electrode 79, it is possible to optimize the potential distribution while current is flowing.

(Embodiment 8)

Figure 13:
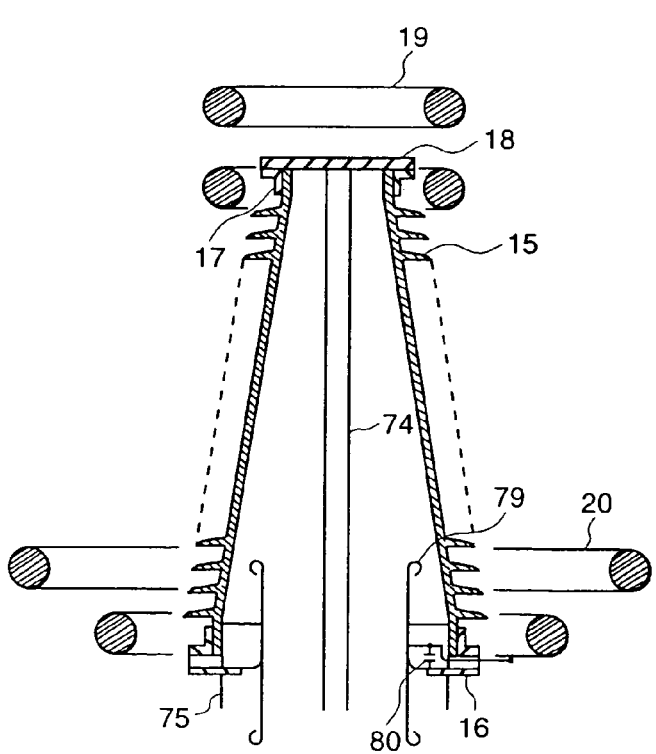

An eighth embodiment of the present invention will be described with reference to FIG. 13. The gas insulating bushing of this embodiment is an altered example of the seventh embodiment, wherein a capacitor 80 is installed on the outer-periphery side of the intermediate potential electrode 79 instead of the internal shield 21, and one end side of the capacitor 80 is electrically connected to the intermediate potential electrode 79. The other end side of the capacitor 80 is grounded. This arrangement constitutes the electrostatic capacity between the intermediate potential electrode 79 and the grounding. According to this embodiment, the same effect as the seventh embodiment can be expected.

(Embodiment 9)

Figure 14:
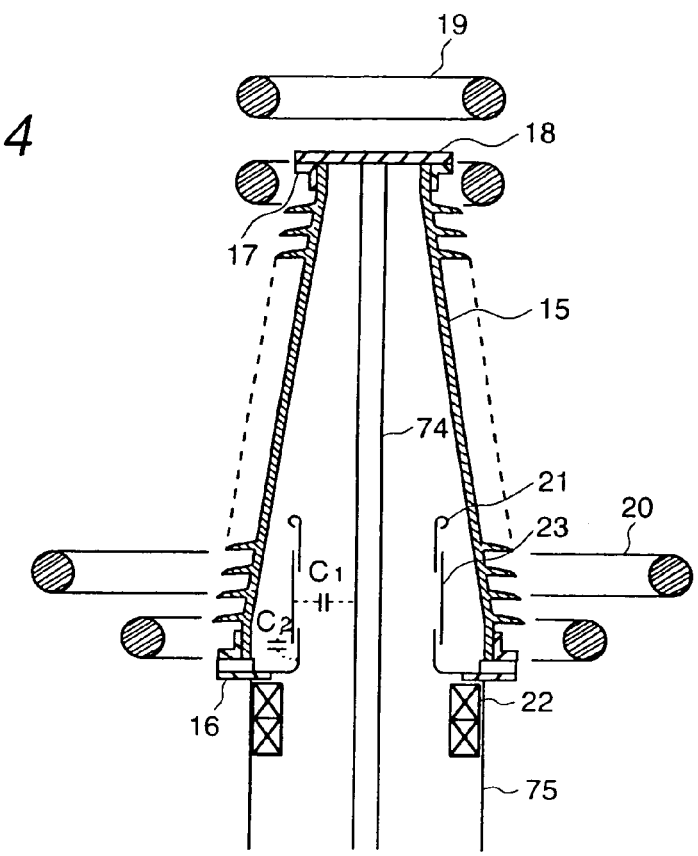

A ninth embodiment of the present invention will be described with reference to FIG. 14. The gas insulating bushing of this embodiment is an altered example of the first and second embodiments, wherein a voltage divider 23 is installed between the porcelain tube 15 and the internal shield 21 and a current transformer 22 is installed inside the tank 75 and below the internal shield 21. According to this embodiment, in the same manner as the first and second embodiments, a current transformer unit and a voltage transformer unit which are conventionally provided as separate, single units can be eliminated. As a result, the size of the gas insulation switchgear can be reduced.

(Embodiment 10)

Figure 15:
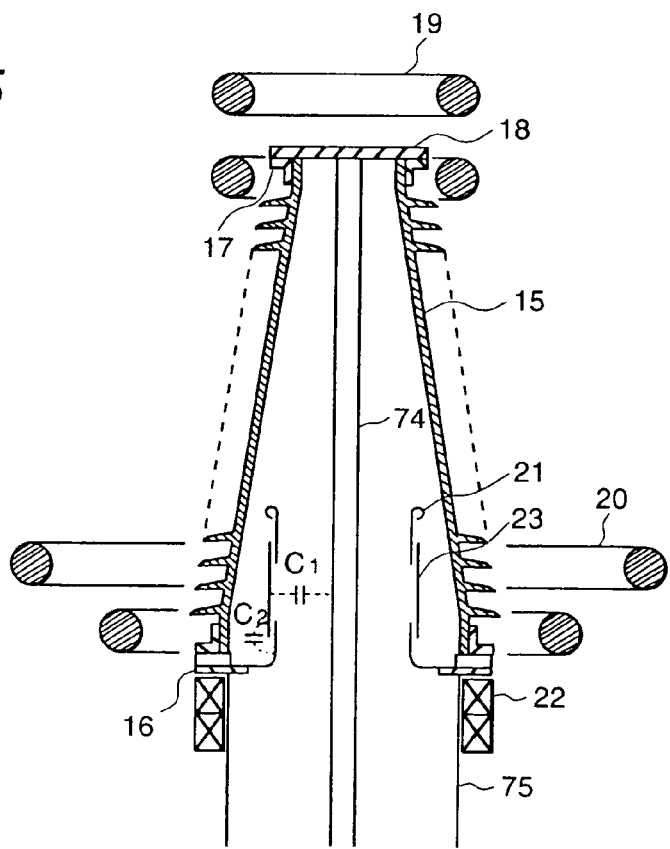

A tenth embodiment of the present invention will be described with reference to FIG. 15. The gas insulating bushing of this embodiment is an altered example of the first and second embodiments, wherein a voltage divider 23 is installed between the porcelain tube 15 and the internal shield 21 and a current transformer 22 is installed on the outer-periphery side of the tank 75. According to this embodiment, in the same manner as the first and second embodiments, a current transformer unit and a voltage transformer unit which are conventionally provided as separate, single units can be eliminated. As a result, the size of the gas insulation switchgear can be reduced.

(Embodiment 11)

Figure 16:
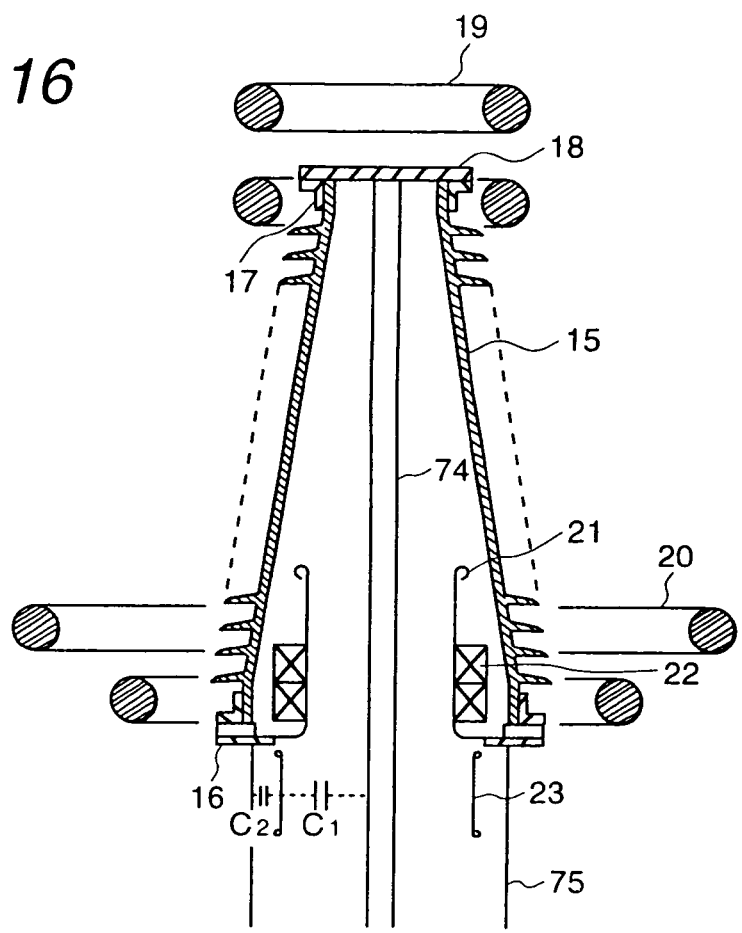

An eleventh embodiment of the present invention will be described with reference to FIG. 16. The gas insulating bushing of this embodiment is an altered example of the first and second embodiments, wherein a current transformer 22 is installed between the porcelain tube 15 and the internal shield 21 and a voltage divider 23 is installed inside the tank 75 and below the internal shield 21. According to this embodiment, in the same manner as the first and second embodiments, a current transformer unit and a voltage transformer unit which are conventionally provided as separate, single units can be eliminated. As a result, the size of the gas insulation switchgear can be reduced.

(Embodiment 12)

Figure 17:
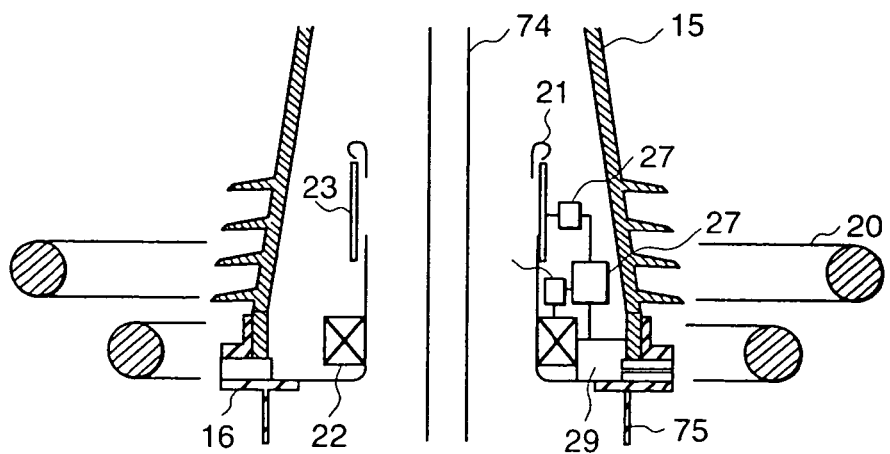

A twelfth embodiment of the present invention will be described with reference to FIG. 17. The gas insulating bushing of this embodiment is an altered example of the first and second embodiments, wherein a filter 27, a signal processing unit 28, and an E/O converter 29 which are installed outside the gas insulating bushing, are herein installed in the space portion between the porcelain tube 15 and the internal shield 21 together with the current transformer 22 and the voltage divider 23. This arrangement allows signals to be easily transmitted from the gas insulating bushing to the supervisory control device 30. Further, because signals are optically transmitted, they neither attenuate nor are affected by outside noise. Accordingly, accurate measurement is possible.

Moreover, in this embodiment, the example where the filter 27, the signal processing unit 28 and the E/O converter 29 are installed inside the gas insulating bushing has been described, and in addition, there are a variety of examples where only the filter 27 is installed, or the filter 27 and the E/O converter 29 are installed.

(Embodiment 13)

Figure 18:
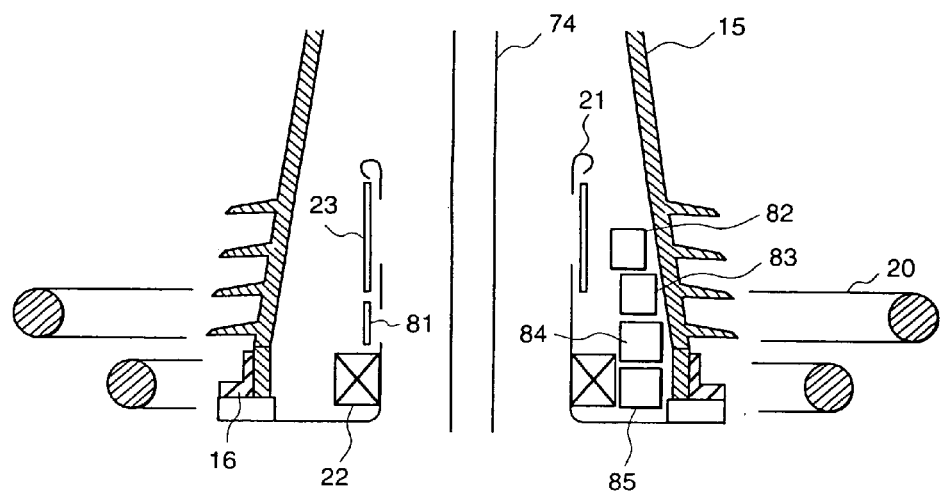

A thirteenth embodiment of the present invention will be described with reference to FIG. 18. The gas insulating bushing of this embodiment is an altered example of the first and second embodiments, In the first and second embodiments, the example where the current transformer 22 and the voltage divider are disposed in the space portion between the porcelain tube 15 and the internal shield 21 has been described, while in this embodiment, in addition to the current transformer 22 and the voltage divider 23, there are provided a partial discharge detector 81 for detecting partial discharge in the gas insulation switchgear, an insulating gas component detector 82 for detecting insulating gas components, a water content detector 83 for detecting water content, an insulating gas pressure detector 84 for detecting insulating gas pressure, and an insulating gas density detector 85 for measuring insulating gas density. Furthermore, it is possible to install other detectors that can output electrical signals, such as a temperature detector for detecting insulating gas temperature.

Moreover, a partial discharge detector 81 can be added to detect partial discharge in the gas insulation switchgear, however, it is possible to make the current transformer 22 and the voltage divider 23 to function in the same way as a partial discharge detector. Further, it is preferable to use a partial discharge detector 81 that has a good frequency responsiveness (high-frequency band from several MHz to several GHz) so as to increase the S/N ratio and measurement accuracy.

(Embodiment 14)

Figure 19:
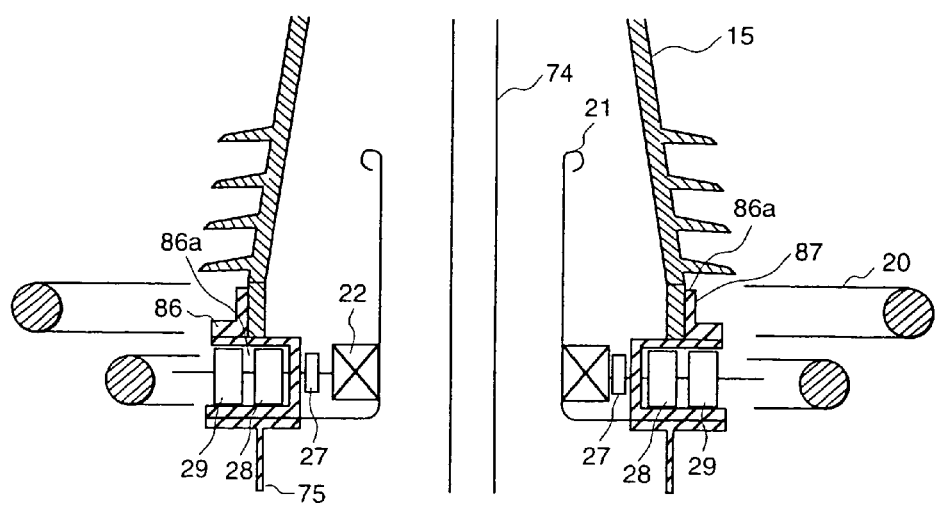

A fourteenth embodiment of the present invention will be described with reference to FIG. 19. The gas insulating bushing of this embodiment is an altered example of the twelfth embodiment, wherein the signal processing unit 28 and the E/O converter 29 can be installed outside the gas insulating bushing. For this reason, this embodiment provides a metal container 86 between the porcelain tube 15 and the tank 75.

The metal container 86 is an annular member and is disposed between the flange portion 87 fixed to the lower-end portion of the porcelain tube 15 and the flange portion of the tank 75, and is mechanically connected to those. At two locations, dent portions 86a recessed from the outer-periphery side toward the inner-periphery side are formed diametrically facing each other on the line which passes through the center point of the metal container 86. A signal processing unit 28 and an E/O converter 29 are installed in the dent portions 86a respectively.

Moreover, in this embodiment, the filter 27 is installed on the outer-periphery side of the internal shield 21 together with the current transformer 22. Further, the filter 27 and the signal processing unit 28 are electrically connected with a signal line hermetically drawn from the side wall of the dent portions 86a. Furthermore, this embodiment shows an example where a current transformer 22 is installed, however, a voltage divider, or both a current transformer and a voltage divider can also be installed. Furthermore, this embodiment formed dent portions 86a at least at two locations, however, dent portions can be provided at more locations, and also the same number of dent portions as that of detectors can be installed inside the porcelain tube 15.

As described above, according to this embodiment, a metal container 86 having dent portions 86a are provided, and the signal processing unit 28 and the E/O converter 29 are installed in the dent portions 86a. This arrangement makes it easy to maintain and inspect those devices without dissembling the gas insulating bushing. Accordingly, the maintenance efficiency of the gas insulation switchgear can be increased.

Furthermore, according to this embodiment, the signal processing unit 28 and the E/O converter 29 are installed respectively at the dent portions 86a formed at least at two locations in the metal container 86. Therefore, it is possible to operate the devices on one side as main devices and those on the other side as backup devices. Accordingly, even if the main devices malfunction, measurements can be performed by using the backup devices; it is possible to continuously measure current flowing through the current-carrying conductor 74 and voltage. As a result, the reliability of the gas insulation switchgear can be increased.

(Embodiment 15)

Figure 20:
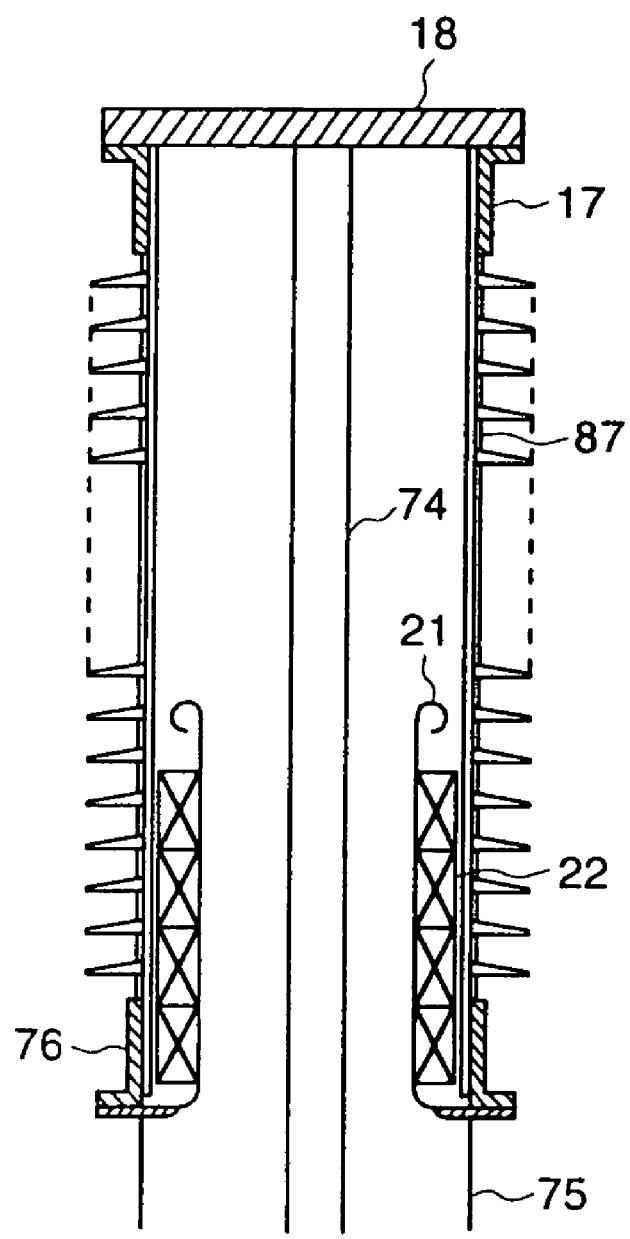

A fifteenth embodiment of the present invention will be described with reference to FIG. 20. The gas insulating bushing of this embodiment has a porcelain tube which is different in shape and structure from that of the previous embodiments. The porcelain tube 87 of this embodiment is made of an insulating member which laminates two different kinds of insulants, is cylindrical, and has a plurality of drape-like protrusions on the outer-periphery side. Two different kinds of insulants are, for example, an insulant, called FRP, formed by impregnating glass cloth in epoxy resin, and an insulant made of polymeric material such as silicon rubber. The porcelain tube 87 is formed so that the insulant made of polymeric material is disposed on the outer-periphery side.

An internal shield 21 is provided inside the porcelain tube 87 and a current transformer 22 for measuring current flowing through the current-carrying conductor 74 is installed on the outer-periphery side thereof. Further, in this embodiment, the example where a current transformer 22 is installed has been described, however, a voltage divider for measuring voltage of the current-carrying conductor 74, or both the current transformer and the voltage divider can be installed. Furthermore, the detecting signal from the current transformer 22 can be taken out from the gas insulating bushing by installing a flange member having a signal take-out portion.

As described above, according to this embodiment, a current transformer 22 or a voltage divider, or both, are installed between the porcelain tube 87 and the internal shield 21. Therefore, as is the case with the previous embodiments, a current transformer unit or a voltage transformer unit, or both, which are conventionally provided as separate, single units can be eliminated. Consequently, the size of the gas insulation switchgear can be reduced.

INDUSTRIAL FIELD OF APPLICATION

The present invention, which can reduce the size of the gas insulating apparatus or increase the reliability of a gas insulating apparatus by combining the sensor portion and the bushing of the device for measuring either current or voltage of the line, or both, can be used as a gas insulating apparatus which is installed in a small electric power substation or switching station or as a gas insulating apparatus which is to enlarge the protected area of a measuring device so as to increase the reliability.

What is claimed is:

1. A gas insulating apparatus comprising a line that is constructed so that electric power drawn out from a bushing is led to a bus unit, the bus unit in which three phase components of a bus are contained, the electric power being led through at least a first disconnector unit, a circuit breaker unit and a second disconnector unit, wherein a sensor portion of a device for measuring at least either current flowing through said line or voltage of said line is disposed inside said bushing.

2. A gas insulating apparatus comprising a line that is constructed so that electric power led out from a bushing is led to a bus unit, the bus unit in which three phase components of a bus are contained, the electric power being led through at least a first disconnector unit, a circuit breaker unit and a second disconnector unit, wherein a sensor portion of a device for measuring at least either current flowing through said line or voltage of said line is disposed inside said bushing, and wherein said sensor portion and said bushing are mechanically and functionally combined with each other, and measurement of at least one of the current and the voltage and lead in of electric power are conducted in one bushing.

3. A gas insulating apparatus according to claim 2, wherein said bushing comprises a porcelain tube which is an insulating tube, a current-carrying conductor arranged inside said porcelain tube, and an electric field relaxation member arranged inside said porcelain tube at an outer periphery side of said current-carrying conductor so as to face said current-carrying conductor, and an electrode electrically connecting said current-carrying conductor and another member.

4. A gas insulating apparatus according to claim 2, wherein said bushing comprises a porcelain tube which is an insulating tube, a current-carrying conductor arranged inside said porcelain tube, an electric field relaxation member arranged outside said porcelain tube, and an electrode electrically connecting said current-carrying conductor and another member.

* * * * *